US006707338B2

(12) United States Patent
Kenington et al.

(10) Patent No.: US 6,707,338 B2
(45) Date of Patent: Mar. 16, 2004

(54) CONTROL SCHEME FOR DISTORTION REDUCTION

(75) Inventors: Peter Kenington, Chepstow (GB); Anthony Michael New, Bristol (GB)

(73) Assignee: Andrew Corporation, Orland Park, IL (US)

(*) Notice: Subject to any disclaimer, the term of this patent is extended or adjusted under 35 U.S.C. 154(b) by 13 days.

(21) Appl. No.: 10/148,995

(22) PCT Filed: Dec. 1, 2000

(86) PCT No.: PCT/GB00/04617
§ 371 (c)(1),
(2), (4) Date: Oct. 29, 2002

(87) PCT Pub. No.: WO01/41298
PCT Pub. Date: Jun. 7, 2001

(65) Prior Publication Data
US 2003/0102914 A1 Jun. 5, 2003

(30) Foreign Application Priority Data
Dec. 2, 1999 (GB) ............................................. 9928553

(51) Int. Cl.[7] ................................................. H03F 1/26
(52) U.S. Cl. .......................................... 330/149; 330/10
(58) Field of Search ................................ 330/149, 151, 330/10

(56) References Cited

U.S. PATENT DOCUMENTS 6,577,192 B2 * 6/2003 Maniwa et al. ............. 330/149

FOREIGN PATENT DOCUMENTS

GB     2337196      11/1999
JP     05211415   *  8/1993

OTHER PUBLICATIONS

Murai et al. "A High–Power Added Efficiency GaAs Power MESFET Operating at a Very Low Drain Bias for Use in L–Band Medium–Power Amplifiers" GalliumArsenide Integrated Circuit Symposium, 1992, Oct. 4–7, 1992 pp. 139–142.*

* cited by examiner

Primary Examiner—Michael B. Shingleton
(74) Attorney, Agent, or Firm—Mendelsohn & Associates, P.C.

(57) ABSTRACT

In predistorter (100), non-linear element (126) generates a distortion signal which is injected into the input (110) of a non-linear power amplifier (112 at 118). The distortion signal is optimised by a vector modulator to cancel distortion caused by amplifier (112). The control signals for the vector modulator are provided by a digital signal processor (FIG. 2). The input signal (110) and the output signal (114) are sampled and processed to produce an audio frequency error signal which is correlated in the DSP to produce the control signals for the vector modulator whilst avoiding analogue correlation problems.

18 Claims, 4 Drawing Sheets

CONTROL SCHEME FOR DISTORTION REDUCTION

This invention relates to a method of, and apparatus for, producing control signals to control a distortion reducing mechanism, such as may be used to linearise the output of a non-linear power amplifier.

A known control scheme for an amplifier predistortion arrangement comprises, as described in WO 99/45640, a mixer (e.g. 685 in that document) for multiplying a reference signal with a feedback signal derived from the output of the amplifier, which latter signal contains residual distortion. The mixing process is equivalent to a correlation process in that any component in the feedback signal which is equivalent in frequency to a component in the reference signal is mixed down to baseband and contributes to the DC component (i.e. at 0 Hz) of the mixer output. The mixer output is then integrated to remove AC components therein and is then used as a feedback control signal for the predistorter. That is, the DC component is isolated as the wanted signal. In the mixer, the type of detection performed is known as coherent detection since the wanted signal always appears at the same frequency, 0 Hz (unless, that is, the feedback signal supplied to the mixer has been frequency shifted by a local oscillator (LO), in which case the wanted signal always appears at the LO frequency.) This is distinct from incoherent conversion, where the wanted signal component will not always be mixed down to the same frequency.

In the control scheme described above, there are problems will DC offsets and offset drift in the correlation process. This is due to the correlation processes being performed in the analogue domain, resulting in a DC output. Ideally, this DC level would be directly proportional to the quantity being measured, (e.g. the amount of residual intermodulation distortion present), and would result in a zero volt output when the quantity has been minimised, (i.e. eliminated).

Unfortunately, analogue correlators (e.g. mixers or multipliers) more typically have a DC offset and hence their output will not fall to zero when the correlation result is minimised. In addition, this offset value will drift with time, temperature changes and input signal level changes, and hence it is usually difficult to use subtraction to cancel the offset with any degree of accuracy. The presence of such offsets and their fluctuating nature limits the achievable linearisation performance of the predistorter.

According to a first aspect, the invention provides a method of reducing the appearance of distortion in an output signal which a signal handling means produces in response to an input signal, the method comprising: sampling both the input and output signals; frequency shifting one of the sampled signals by a frequency offset amount; converting, by detection, the frequency-offset sampled signal and the other sampled signal to baseband signals, processing the baseband signals to produce control signals; and predistorting the input signal under control of the control signals.

According to a second aspect, the invention also provides apparatus for reducing the appearance of distortion in an output signal which a signal handling means produces in response to an input signal, the apparatus comprising means for sampling both the input and output signals, means for frequency shifting one of the sampled signals by a frequency offset amount, means for converting, by detection, the frequency offset sampled signal and the other sampled signal to baseband signals, means for processing the baseband signals to produce control signals, and means for predistorting the input signal under control of the control signals.

The invention advantageously uses detector-based down-conversion, rather than local oscillator based down conversion with its associated disadvantages. In the present context, frequency conversion to baseband by detection relates to frequency conversion to baseband without the use of local oscillator signals. It can either involve implicit multiplication (by, e.g. square-law detectors which output the square of their input), or can be achieved by correlation of, for example, an input signal with a related output signal (using, e.g. a mixer, a multiplier, or a non-linear device such as a diode). No additional or auxiliary signals (such as local oscillators and the like) are required to perform the frequency conversion.

Another advantage of the invention is that it produces baseband signals suitable for conversion to digital signals to allow the control signals to be produced in the digital domain in, for example, a digital signal processor. This means that the process of producing the control signals may be performed using digital correlation thus avoiding DC-offsets and DC-offset drift associated with mixers and multipliers used in analogue correlation processors.

In a preferred embodiment, the sampled input signal is multiplied with itself to produce a first reference signal which is one order higher than a target distortion component of a particular order in the output signal. The sampled input signal may be multiplied with the sampled output signal to produce a second reference signal. The first and second reference signals may be multiplied together to produce a third reference signal at the offset frequency. The third reference signal may be multiplied with a signal at the offset frequency in the digital domain to produce DC signals for controlling the predistortion process.

In an alternative embodiment, however, the third reference signal may be multiplied with a signal at the offset frequency on the analogue domain.

As mentioned above, producing the DC control signals in the digital domain may substantially eliminate the problems of DC offset and DC offset drift associated with analogue methods of producing control signals. The target distortion component may be a third order distortion component, and the control signals developed by correlating with the target distortion component may be used to control the predistorter in the suppression of the target distortion component or a wider spectrum of distortion.

The preferred embodiment may also include multiplying the sampled input signal with itself to produce further reference signals, each of which is one order higher than a corresponding target distortion component of a specific order appearing in the output signal, and multiplying each further reference signal with the second reference signal to produce modified further reference signals at the offset frequency. The modified further reference signals may be multiplied with a signal at the offset frequency to produce DC control signals for controlling the predistortion process to substantially eliminate distortion appearing in the output signal and corresponding to the respective target distortion components. In this way, the system can be extended to individual control of the predistorter to combat distortion appearing at individual target distortion components.

In a preferred embodiment, the predistortion process is diode, FET, Bipolar transistor, dual-gate FET or mixer based.

By way of example only, certain embodiments of the invention will now be described with reference to the accompanying drawings, in which.

Figure 1:
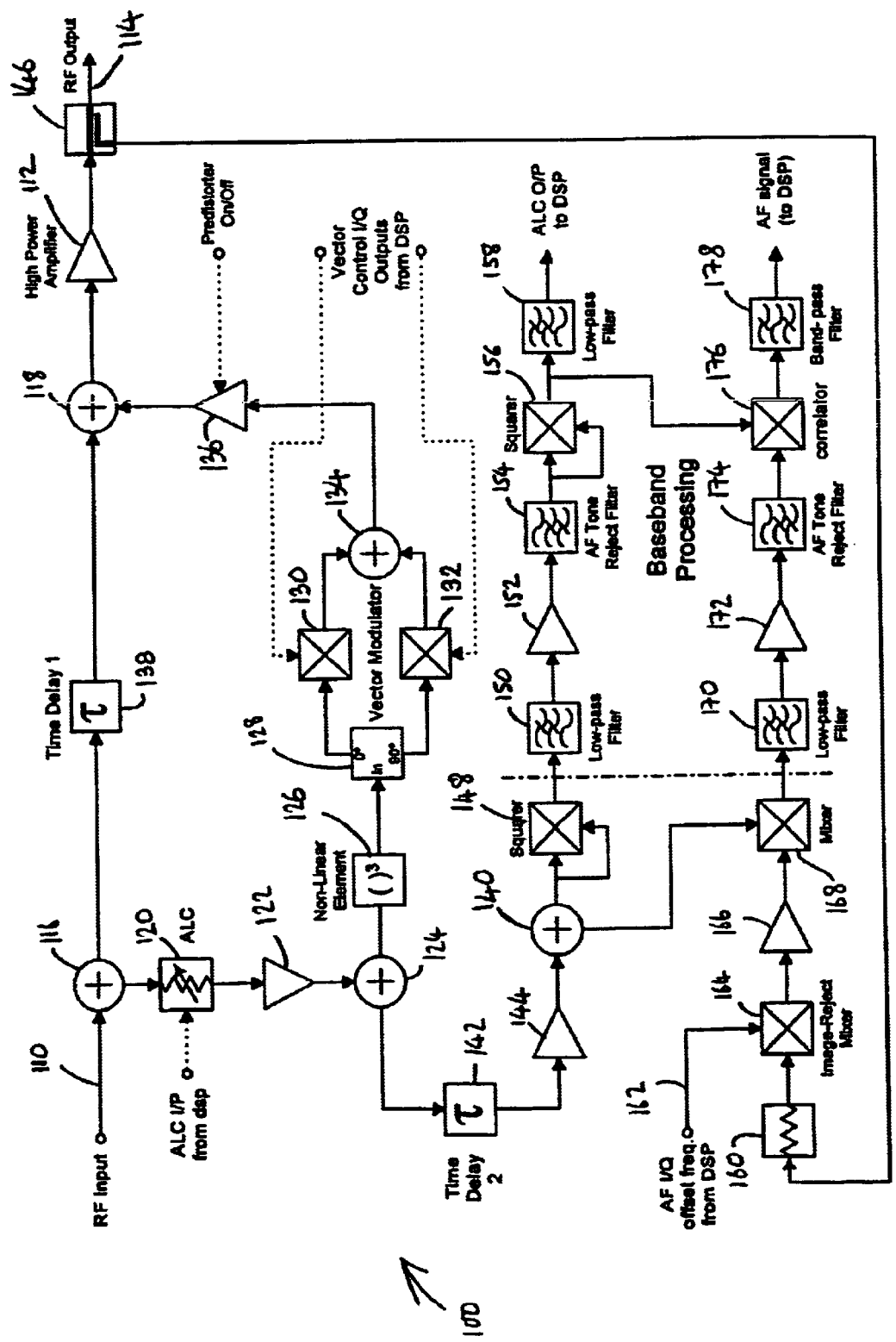
FIG. 1 is a schematic diagram of a predistorter arrangement for linearising an amplifier.

The predistorter 100 shown in FIG. 1 operates on the RF input signal 110 to non-linear power amplifier 112 in order to reduce distortion appearing in its output 114.

The predistorter 100 comprises a splitter 116 which removes a portion of the RF input 110 to form the basis of a predistortion signal which is recombined with the input signal at combiner 118. The portion of the input signal removed at splitter 116 is adjusted to an appropriate amplitude level by automatic level controller 120. The desired amplitude level is set by a control signal from a digital signal processor (shown in FIG. 2). The extracted portion of the RF input signal is then amplified at 122 and supplied to splitter 124. The input signal is supplied from splitter 124 to non-linear element 126 which produces a third order component of the input signal. The third order component is converted into inphase and quadrature components at 128. Each of the inphase and quadrature components is multiplied (at 130 and 132) with respective control values produced by a digital signal processor (shown in FIG. 2). The modulated inphase and quadrature components are then combined at 134 to produce a predistortion signal. The predistortion signal is amplified at 136 and injected into the main RF input signal path at 118. The predistorter 100 can be switched on and off by switching amplifier 136 on and off. This allows the predistorter 100 to be disabled at low input signal levels where distortion is not intolerable and where predistortion may contribute to, rather than suppress, distortion appearing in the output 114. Alternatively, the on/off function can be provided by means of a PIN diode switch, or other form of RF switch (e.g. FET, relay, etc.). A time delay 138 is provided in the main RF input signal path so that the signals arriving at combiner 118 are appropriately time aligned.

Splitter 124 also provides the sampled RF input signal to a further splitter 140 via a time delay 142 and an amplifier 144. The signals from splitter 140 are processed in conjunction with a portion of the output signal of amplifier 112 removed at splitter 146. Time delay 142 appropriately time-aligns the signal provided to splitter 140 with the signal fed back from splitter 146. The sampled input signal is provided from splitter 140 to both inputs of a mixer 148 which outputs a squared version of the input signal. The squared signal produced by mixer 148 is low pass filtered at 150, amplified at 152, filtered again at 154, and squared again using mixer 156 to produce a fourth order signal. Where the input 110 comprises a two tone test signal, then the fourth order signal will be a fourth order signal at baseband, that is, a signal with a frequency twice that of the tone spacing in a two-tone test (with virtually no leakage at the tone spacing frequency). The fourth order signal produced by mixer 156 contains a DC component which varies with the input signal level. This DC component is extracted by low pass filter 158 and supplied to the DSP digital signal processor (shown in FIG. 2) to produce an appropriate control signal for the automatic level controller 120.

The portion of the RF output 114 removed at splitter 146 is attenuated at 160. The attenuated amplifier output sample is frequency offset by a small amount using an audio frequency tone 162 and an image reject mixer 164. The audio frequency tone 162 is supplied by the DSP to facilitate subsequent correlation. The frequency offset amplifier output sample is then amplified at 166 and supplied to mixer 168. The other input of mixer 168 is supplied with the sampled amplifier input signal, provided by splitter 140 (after being subject to time delay 142 for time alignment purposes). The mixing process at 168 creates a baseband spectrum.

If one considers, for example, a case where amplifier 112 exhibits only third order non-linearity, then, where the input 110 comprises a two tone test signal, the baseband spectrum consists of two frequency components. The two components are a component at the tone difference frequency, offset by an amount equal to the frequency of the injected audio frequency signals 162, and a component at double the tone spacing, again offset by an amount equal to the frequency of the injected audio frequency signals 162. It is the latter component which is of interest in the control system, as this component contains information about the level of the third order intermodulation present in the spectrum of the amplifier output 114, without corruption from the main signal energy of the (downconverted) input signals. The former component also contains this information, but it is masked by the main signal energy of the (downconverted) input signals. The output of mixer 168 is then low pass filtered at 170 and subjected to amplification at 172. Any audio frequency tone feed through component in the baseband signals produced by mixer 168 is blocked by audio frequency tone reject filter 174 prior to the baseband signals undergoing correlation processing.

At mixer 176, the frequency offset, downconverted output of amplifier 112 is correlated with the fourth order reference signal produced by squaring mixer 156. The resulting output of mixer 176 is an error tone at the audio offset frequency, and it contains the gain and phase information needed to steer the predistorter 100 to optimum performance. This signal is isolated by bandpass filter 178 and fed to the DSP.

Figure 2:
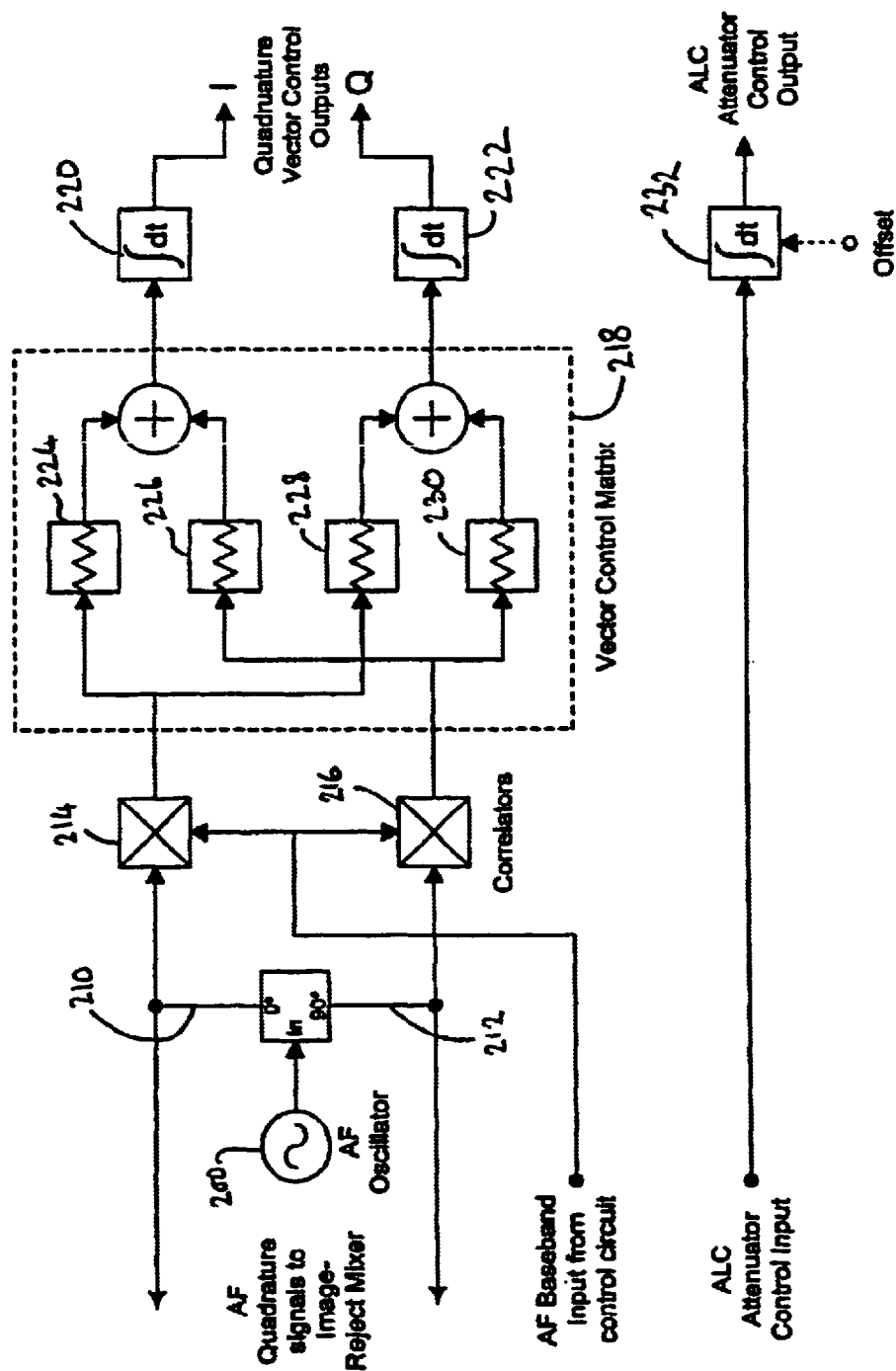
FIG. 2 is a schematic diagram of a digital signal processor operating in the system of FIG. 1.

The DSP, which also forms a part of predistorter 100, is shown in FIG. 2. The DSP implements an audio frequency oscillator 200 which provides inphase and quadarature versions of an audio frequency signal, 210 and 212 respectively, for use in the rest of the system. The signals 210 and 212 are converted into analogue signals and supplied on lines 162 to image reject mixer 164 to frequency offset the sampled amplifier output 114. The signals 210 and 212 are also fed to respective correlating mixers 214 and 216. The remaining input of each of mixers 214 and 216 is supplied with the audio frequency error signal provided by filter 178 (after appropriate analogue to digital conversion). The outputs of correlating mixers 214 and 216 are supplied to vector control matrix 218 which supplies weighted sums of the correlator outputs to integrators 220 and 222. The weighting factors are determined by attenuators 224 to 230 in vector control matrix 218. The vector control matrix allows control system phase offset to be adjusted and eliminated if necessary. The outputs of integrators 220 and 222 provide, respectively, the I and Q control inputs for the mixers 130 and 132 in the vector modulator which controls the amplitude and phase characteristics of the predistortion which is injected into the input signal for amplifier 112. The DSP also receives an automatic level control output from mixer 158 (again, after appropriate analogue to digital conversion). This signal is supplied to integrator 232 which has an appropriate offset value. The function of the integrator 232 is to steer the automatic level control signal to be equal to the offset value. The offset value is chosen such that the drive level of the non-linear element is optimised. The signal output by integrator 232 is converted into an analogue control signal and supplied to automatic level controller 120 in FIG. 1.

Figure 3:
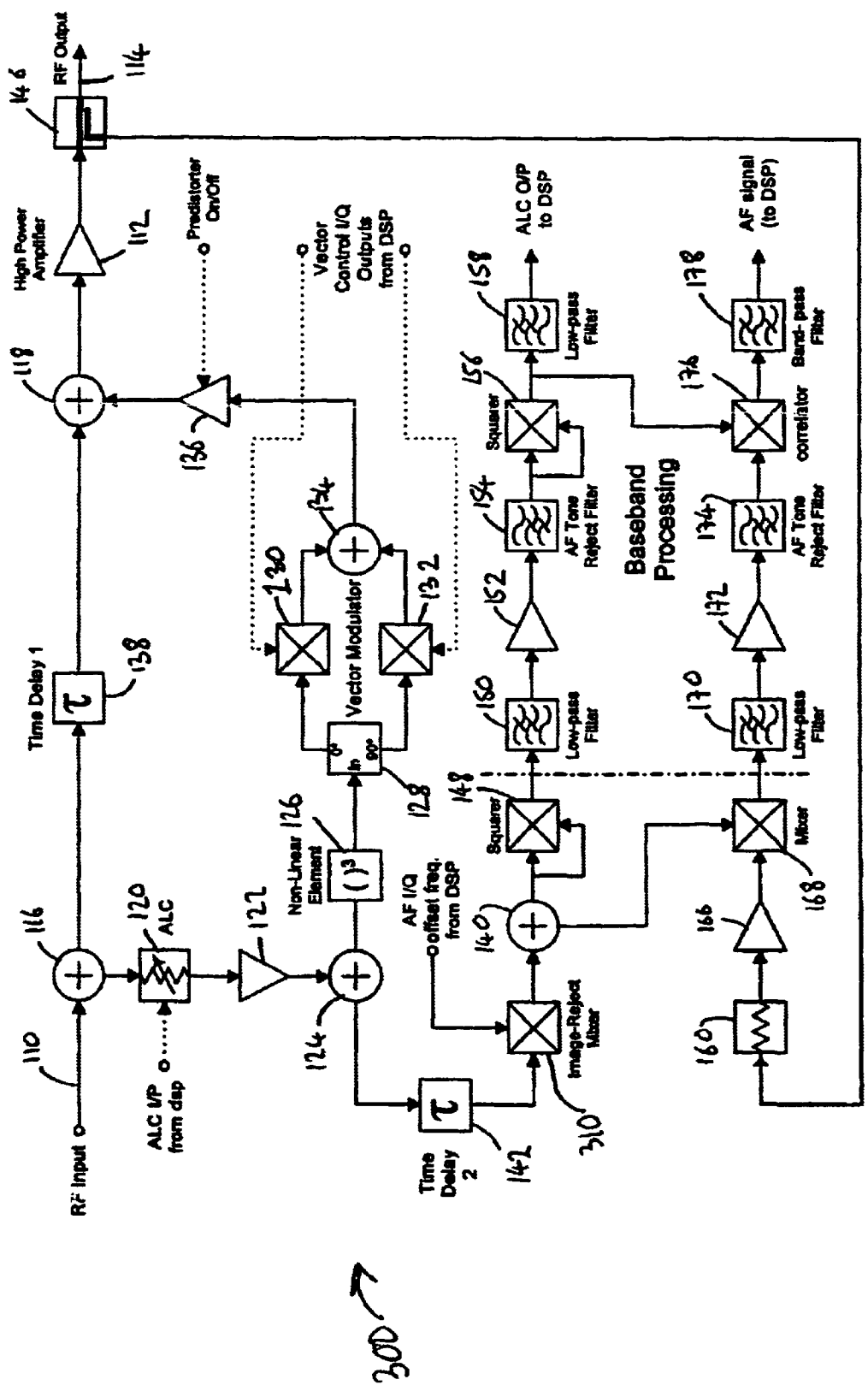
FIG. 3 is a second predistorter arrangement for linearising an amplifier.

An alternative version of the predistorter 100 described in FIG. 1 is shown in FIG. 3. In FIG. 3, components carried over from FIG. 1 retain the same reference numerals and their functions will not be described again in detail. In the predistorter 300 of FIG. 3, it is the sampled input signals 110 which are frequency offset by image reject mixing with the audio frequency tone provided by the DSP, instead of the sampled output signal 114. The image reject mixer 310 is located between time delay 142 and splitter 140. The operation of predistorter 300 is broadly the same as that of predistorter 100 and the DSP used in conjunction with predistorter 300 may perform in the same way as the DSP used in conjunction with predistorter 100. The main difference is that correlation may be performed at three times the audio tone frequency as an alternative to correlating at the tone frequency itself. This may ease the tone feed through specification/filtering in some applications.

Figure 4:
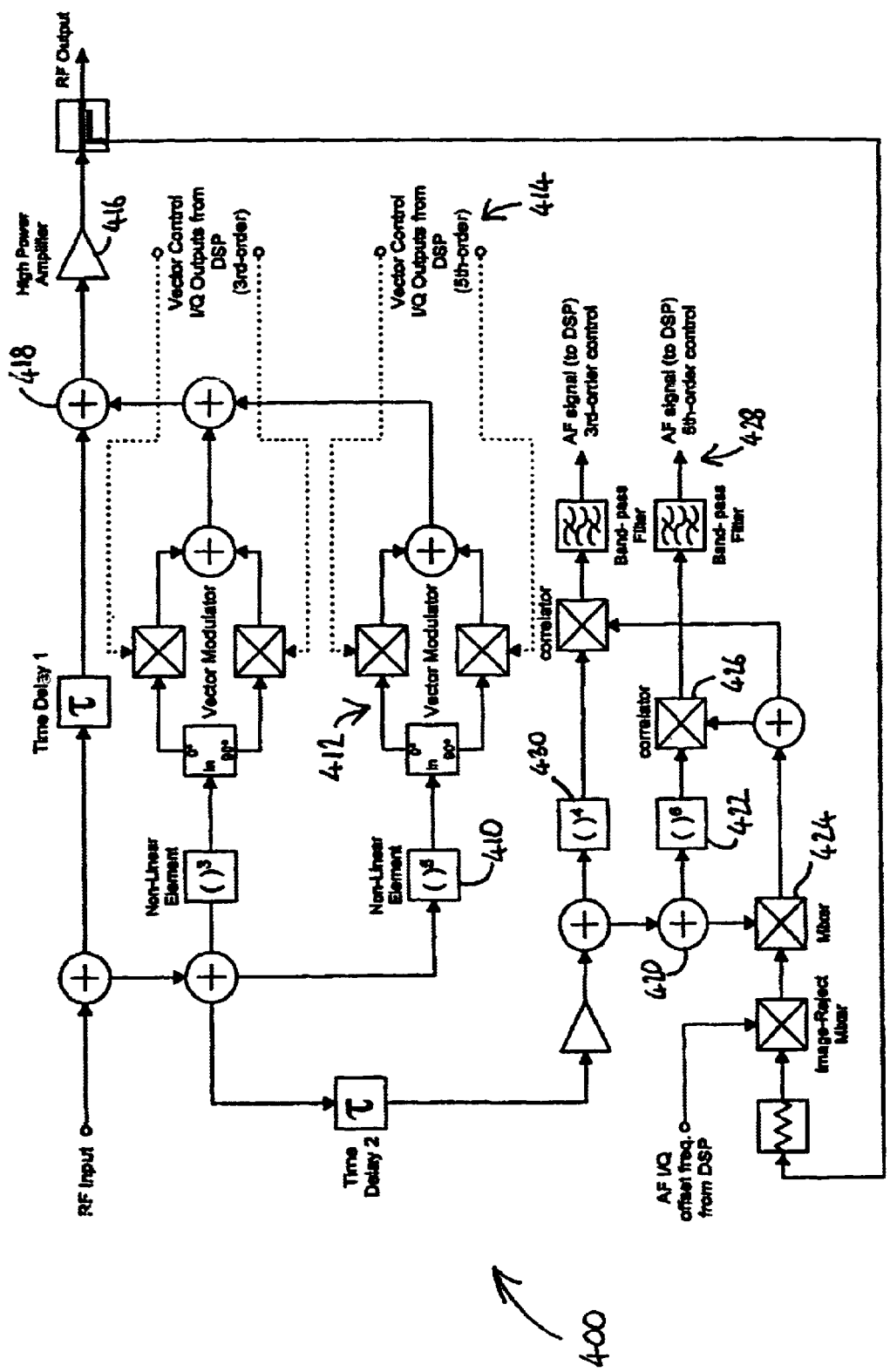
FIG. 4 is a third predistorter arrangement for linearising an amplifier.

The predistorter 400, shown in FIG. 4, is a modified version of the predistorter 100, shown in FIG. 1. To simplify the description, the automatic level control process (120 in FIG. 1) has been omitted and the two consecutive squaring processes used to produce the fourth order signal used in controlling the third order predistortion component have been abbreviated as a single fourth order generation process 430.

The predistorter 400 includes a fifth order non-linear element 410 for generating a fifth order component from the RF input signal. The fifth order component is adjusted by vector modulator 412 under the control of signals 414 from the DSP and is then injected into the input signal to amplifier 416 at combiner 418. The vector modulator 412 adjusts the fifth order signal to cancel fifth order IMD in the output of amplifier 416. The process for generating the control signals 414 will now be described.

A portion of the time delayed, sampled RF input signal, is removed at splitter 420 and is supplied to process 422 which produces a sixth order component from the input signal. The output of mixer 424 is correlated with the sixth order signal at mixer 426 to produce an error signal 428 which is used by the DSP to generate the control signals 414. The DSP handles the signal 428 in an analogous manner to the error signal 178 in FIG. 1. The error signal 428 is mixed with inphase and quadrature versions of a local oscillator signal at the offset frequency to produce I and Q signals for the vector modulator 412. The control scheme steers the third and fifth order predistortion components to minimise the third and fifth order IMD distortion appearing in the sampled output signal of amplifier 416.

It will be apparent that this system can be extended to further, higher order predistortion components (for example, seventh, ninth, etc. components) in a straightforward manner. Additionally, it is possible to mix the audio frequency signal into the sampled input signal rather than the sampled output signal, in the manner shown in FIG. 3.

What is claimed is:

1. Apparatus for reducing the appearance of distortion in an output signal which signal handling equipment produces in response to an input signal, the apparatus comprising:
    a sampler for sampling both the input and output signals;
    a shifter for frequency shifting one of the sampled signals by a frequency offset amount;
    a converter for converting, by incoherent detection, the frequency-offset sampled signal and the other sampled signal to baseband signals,
    a controller for processing the baseband signals to produce control signals; and
    a predistorter for predistorting the input signal under control of the control signals.

2. Apparatus according to claim 1, including a multiplier for multiplying the sampled input signal with itself to produce a first reference signal which is one order higher than a target distortion component of a particular order in the output signal.

3. Apparatus according to claim 2, including a multiplier for multiplying the sampled input signal with the sampled output signal to produce a second reference signal.

4. Apparatus according to claim 3, including a multiplier for multiplying the first and second reference signals together to produce a third reference signal at the offset frequencey.

5. Apparatus according to claim 4, including a multiplier for multiplying, in the digital or analog domain, the third reference signal with a signal at the offset frequency to produce DC signals for controlling the predistorter.

6. Apparatus according to claim 2, wherein the target distortion component is a third order distortion component.

7. Apparatus according to claim 1, wherein the predistorter reduces distortion in the form of one specific distortion component of one specific order.

8. Apparatus according to claim 1, wherein the predistorter reduces distortion in the form of several distortion components of different orders.

9. Apparatus according to claim 8, further comprising a multiplier for multiplying the sampled input signal with itself to produce further reference signals each one order higher than a corresponding target distortion component appearing in the output signal.

10. Apparatus acoording to claim 9, further comprising a multiplier for multiplying each further reference signal with the second reference signal to produce modified further reference signals at the offset frequency.

11. Apparatus according to claim 10, comprising a multiplier for multiplying, in the digital or analog domain, each modified further reference signal with a signal at the offset frequency to produce DC signals for controlling the predistorter.

12. Apparatus according to claim 1, wherein the sampled input signal is the one of the sampled signals which is frequency shifted by the frequency offset amount.

13. Apparatus according to claim 1, wherein the sampled output signal is the one of the sampled signals which is frequency shifted by the frequency offset amount.

14. Apparatus according to claim 1, wherein the DC signals are used to control the I and Q paths of one or more vector modulators in the predistorter.

15. Apparatus according to claim 1, wherein the DC signals are used for controlling amplitude and/or phase of one or more signals in the predistorter.

16. Apparatus according to claim 1, wherein the signal handling equipment comprises one or more amplifiers.

17. Apparatus according to claim 1, wherein the predistorter comprises a multiplier for multiplying the input signal with itself to produce a predistortion signal for injection into the input signal.

18. A method of reducing the appearance of distortion in an output signal which signal handling equipment produces in response to an input signal, the method comprising:
    sampling both input and output signals;
    frequency shifting one of the sampled signals by a frequency offset amount;
    converting, by incoherent detection, the frequency-offset sampled signal and the other sampled signal to baseband signals.
    processing the baseband signals to produce control signals; and
    predistorting the input signal under control of the control signals.

* * * * *